(12) United States Patent
Mertens

(10) Patent No.: US 11,223,343 B2
(45) Date of Patent: Jan. 11, 2022

(54) NOISE SUPPRESSION CIRCUIT FOR DIGITAL SIGNALS

(71) Applicant: NXP USA, Inc., Austin, TX (US)

(72) Inventor: Robert Matthew Mertens, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/848,172

(22) Filed: Apr. 14, 2020

(65) Prior Publication Data

US 2021/0320647 A1 Oct. 14, 2021

(51) Int. Cl.
| | |
|---|---|
| *H03K 5/12* | (2006.01) |
| *H03H 17/02* | (2006.01) |
| *H03K 5/1252* | (2006.01) |
| *H03K 19/20* | (2006.01) |

(52) U.S. Cl.
CPC ....... *H03H 17/0283* (2013.01); *H03K 5/1252* (2013.01); *H03K 19/20* (2013.01)

(58) Field of Classification Search
CPC ... H03H 17/0283; H03K 5/1252; H03K 19/20
See application file for complete search history.

(56) References Cited

U.S. PATENT DOCUMENTS

| | | | |
|---|---|---|---|
| 3,939,413 A | 2/1976 | Milkovic | |
| 4,471,235 A | 9/1984 | Sakhuja et al. | |
| 4,926,072 A | 5/1990 | Hyodo | |
| 7,218,170 B1* | 5/2007 | Carter | G05F 3/262 |
| | | | 323/315 |
| 9,590,605 B2* | 3/2017 | Gopal | H03K 5/1252 |
| 10,033,366 B2* | 7/2018 | Arbetter | H03K 5/04 |
| 2010/0090739 A1 | 4/2010 | Huang | |

* cited by examiner

*Primary Examiner* — Dinh T Le

(57) ABSTRACT

A noise suppression circuit includes a resistor-capacitor (RC) filter where a resistive element of the RC filter has a first terminal configured to receive an input data stream and a second terminal coupled to a circuit node Vrc and a capacitive element coupled to the circuit node, a logic gate having an input coupled to the circuit node and an output configured to provide a filtered data stream, and a switch. The switch is configured to short out the resistive element of the RC filter when the input data stream and the filtered data stream are at a same value and not short out the resistive element when the input data stream and the filtered data stream are at different values.

20 Claims, 6 Drawing Sheets

NOISE SUPPRESSION CIRCUIT FOR DIGITAL SIGNALS

BACKGROUND

Field

This disclosure relates generally to integrated circuits, and more specifically, to noise suppression for a digital signal.

Related Art

Noise suppression of digital signals may be performed by a glitch filter that stops narrow pulses while allowing only wider pulses to pass. This is one effective way of filtering out noises in integrated circuits. While some standards require glitch filters as part of input/output (I/O) circuits, other standards may not, in favor of, for example, faster speeds. Therefore, a need exists for a noise suppression circuit capable of achieving compatibility for different glitch filtering requirements.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a noise suppression circuit for digital signals is provided, which allows for glitch filtering or for faster operation without glitch filtering. In one embodiment, a first data path of the noise suppression circuit enables glitch filtering in which glitches smaller than a particular pulse width are removed from the digital signal. In some embodiments, the pulse width of filtered glitches is configurable. A second data path of the noise suppression circuit does not perform glitch filtering, which may allow for faster operation. Therefore, various control signals can be used to direct input data through either data path. In this manner, the noise suppression circuit can be used for compatibility with different standards, such as, for example, for I2C and the I3C standards. Control signals in the noise suppression circuit may further be used to prevent glitches upon first enabling glitch filtering.

Figure 1:
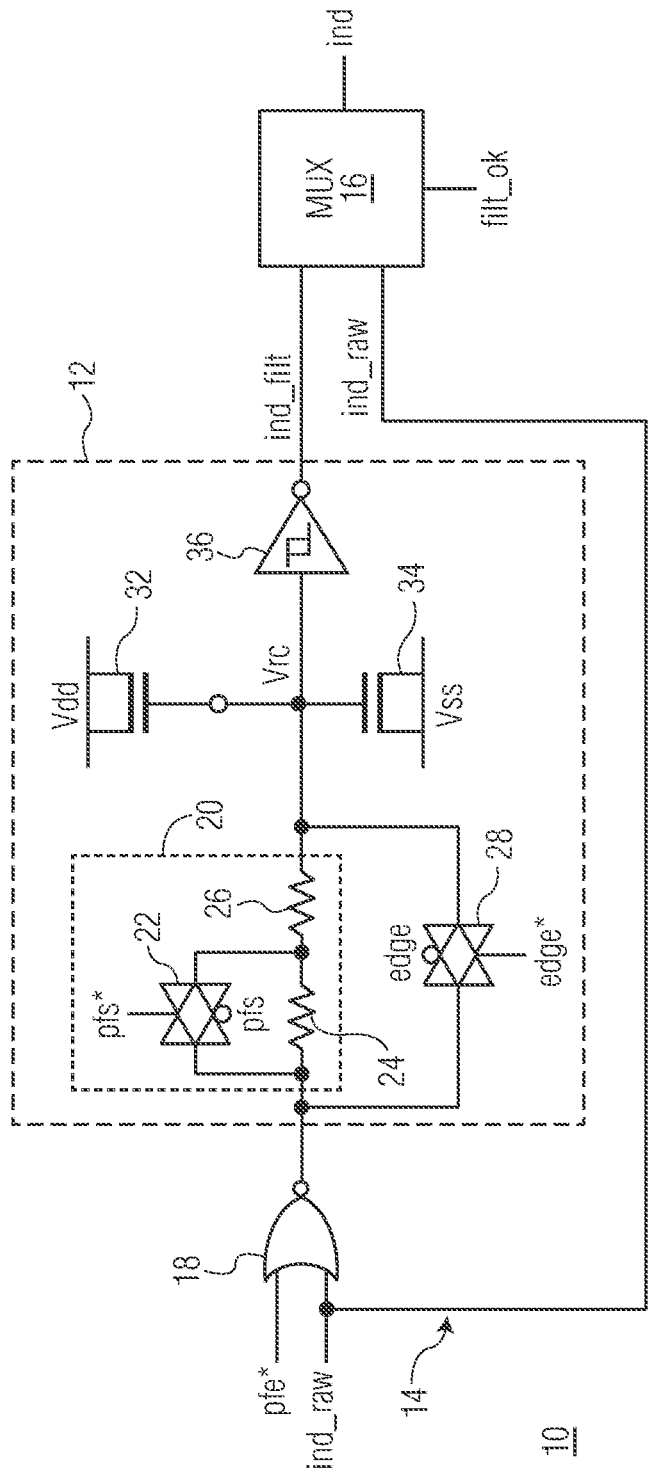
FIG. 1 illustrates, in partial block diagram and partial schematic form, a noise suppression circuit in accordance with one embodiment of the present invention.

FIG. 1 illustrates, in partial block diagram and partial schematic form, a noise suppression circuit 10 of an IC in accordance with one embodiment of the present invention. Noise suppression circuit 10 receives input data, ind_raw. This input data may correspond, for example, to data received at an I/O pad of the IC. Also, since the voltage domain of the I/O pad may operate at higher voltages than internal circuitry of the IC, such as noise suppression circuit 10, the received input data may be level shifted to the voltage domain of noise suppression circuit 10 to provide ind_raw. Noise suppression circuit 10 includes a NOR gate 18, transmission gates 22 and 28, resistive elements 24 and 26, capacitive elements 32 and 34, a Schmitt trigger inverter 36, and a multiplexer (MUX) 16.

A first input of NOR gate 18 is coupled to receive a control signal pfe* and a second input coupled to receive ind_raw. The signal pfe* is the inverse of the control signal passive filter enable (pfe). An output of NOR gate 18 is coupled to a first signal terminal of transmission gate 22, a first signal terminal of transmission gate 28, and a first terminal of resistive element 24. A second terminal of resistive element 24 is coupled to a second signal terminal of transmission gate 22 and to a first terminal of resistive element 26. As second terminal of resistive element 26 is coupled to a second signal terminal of transmission gate 28. The second terminal of transmission gate 28 is coupled to an input of inverter 36 via a circuit node labeled Vrc. One terminal of each of capacitive elements 32 and 34 are coupled to node Vrc, and the other terminal of each of is coupled to a static node (AC ground). Capacitive element 32 may be implemented as a PMOS transistor with a gate coupled to node Vrc and both source and drain coupled to a first supply voltage terminal, and capacitive element 34 may be implemented as an NMOS transistor with a gate coupled to node Vrc and both source and drain coupled to a second supply voltage terminal. The first voltage supply terminal is configured to receive a voltage supply Vdd, and the second voltage supply terminal is configured to receive a voltage supply Vss, which is lower than Vdd. Note that the first and second voltage supply terminals may simply be referred to herein as Vdd and Vss, respectively. An output of inverter 36 provides a filtered data signal, ind_filt, corresponding to the filtered version of ind_raw. MUX 16 is coupled to receive ind_filt and ind_raw, and based on the control signal, filt_ok, provides one of ind_filt and ind_raw as the output data stream, ind. Note that MUX 16 may be referred to as selection circuit and may be implemented using any type of logic circuitry. The output data stream, ind, is considered the output of noise suppression circuit 10, but the output data stream itself is either the filtered or non-filtered (raw) input data stream, and therefore referred to as ind.

Transmission gate 28 receives control signals edge and edge*, in which edge* is the inverse of edge. The signal edge is provided to the inverting control input of transmission gate 28, and edge* to the non-inverting input of transmission gate 28. Transmission gate 28 operates as a switch that is closed when edge is a logic level zero and open when edge is a logic level one. Therefore, transmission gate 28 may be referred to as a switch. When edge is negated to a logic level 0, transmission gate 28 is enabled (i.e. closed) to communicate a signal between the first and second signal terminals of the transmission gate. In the illustrated embodiment, when enabled, transmission gate 28 shorts out (i.e. bypasses) both resistive elements 24 and 26. When edge is asserted to a logic level 1, transmission gate 28 is disabled (i.e. open) so as not to communicate the signal between the first and second signal terminals. In this situation, the transmission gate may be at a high impedance. Transmission gate 22 receives control signals passive filter select (pfs) and pfs*, in which pfs* is the inverse of pfs. The signal pfs is provided to the inverting control input of transmission gate 22, and pfs* to the non-inverting input of transmission gate 22. Transmission gate 22 operates analogously to transmission gate 28 and may also be referred to as a switch. When pfs is negated to a logic level 0, transmission gate 22 is enabled (i.e. closed) thus shorting out resistive element 24. When pfs is asserted to a logic level 1, transmission gate 22 is disabled (i.e. open).

Note that transmission gate 22 and resistive elements 24 and 26 provide a variable resistive element 20. When pfs is negated, resistive element 20 provides a first resistance value (provided by resistive element 26), but when pfs is asserted, resistive element 20 provides a second resistance value (provided by resistive element 24 in series with resistive element 26). Note that alternate embodiments may implement any type of resistive element for resistive element 20, and may provide a constant or variable resistance. For example, in one embodiment, a longer channel transmission gate whose control inputs are coupled to Vdd and Vss may provide a desired constant resistance.

Noise suppression circuit 10 includes two signal paths, path 12 and path 14. Path 12 provides for selective glitch filtering to provide "ind_filt" to MUX 16, while path 14 directly passes ind_raw (which is unfiltered, i.e. without glitch filtering) to MUX 16. Therefore, based on filt_ok, one of ind_filt or ind_raw is provided as the output of noise suppression circuit 10 as ind. The output signal ind corresponds to the "processed" input data (i.e. the selectively glitch filtered input data) that is then used by the internal circuitry of the IC containing noise suppression circuit 10. Therefore, if glitch filtering is required on input data for a particular IC or application, glitch-filtered ind is provided, but if glitch filtering should not be used for a particular IC or application, ind is provided without glitch filtering. Operation of the selective glitch filtering will be described further in reference to the control signals generated by FIG. 2.

Figure 2:
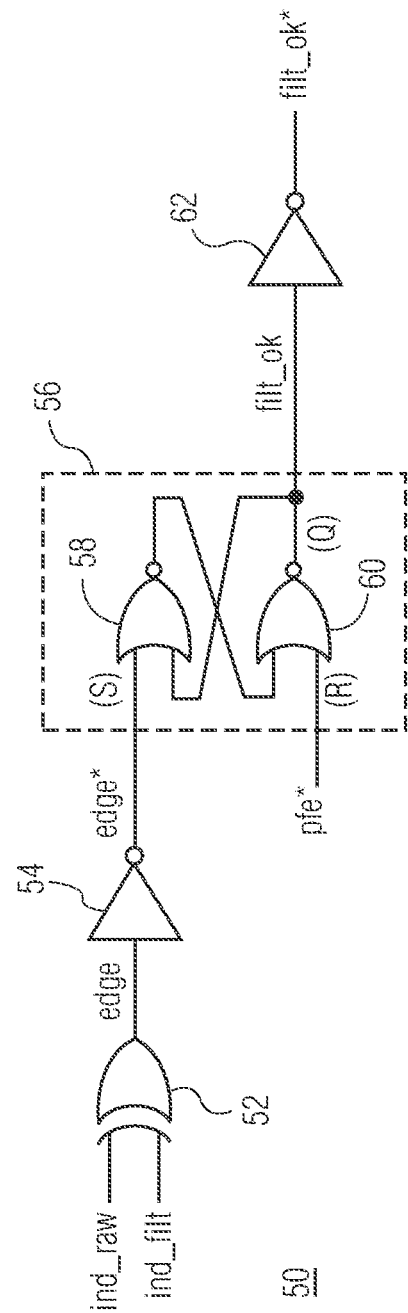
FIG. 2 illustrates control logic for generating control signals for the noise suppression circuit of FIG. 1, in accordance with one embodiment of the present invention.

FIG. 2 illustrates, in schematic form, control logic 50 which generates edge, edge*, filt_ok, and filt_ok* based on ind_raw, ind_filt, and pfe*. Control logic 50 includes an XOR gate 52, inverters 54 and 62, and a set-reset (SR) latch 56. A first input of XOR gate 52 is coupled to receive ind_raw, a second input of XOR gate 52 is coupled to receive ind_filt, and an output of XOR gate 52 provides edge and is coupled to an input of inverter 54. An output of inverter 54 provides edge* and is coupled to the set (S) input of SR latch 56. The reset (R) input of SR latch 56 is coupled to receive pfe*, and a data output (Q) of SR latch 56 provides filt_ok and is coupled to an input of inverter 62. And output of inverter 62 provides filt_ok*.

SR latch 56 includes NOR gates 58 and 60. A first input of NOR gate 58 corresponds to the S input of the SR latch and is coupled to receive edge*. A second input of NOR gate 58 is coupled to an output of NOR gate 60. And output of NOR gate 58 is coupled to a first input of NOR gate 60, and a second input of NOR gate 60 corresponds to the R input and is coupled to receive pfe*. The output of NOR gate 60 corresponds to Q and provides filt_ok. Note that SR latch 56 can be implemented in different ways. In operation, SR latch 56 asserts its output Q to a logic level one when input S is asserted to a logic level one, and resets its output Q to a logic level zero when input R is asserted to a logic level one. Therefore, in the illustrated embodiment, filt_ok is a logic level one when edge is a logic level zero, and is a logic level zero when pfe is a logic level zero.

In operation, when glitch filtering by noise suppression circuit 10 is to be enabled, pfe is asserted to a logic level one (and thus pfe* is a logic level zero). When glitch filtering is enabled (pfe is a logic level one) NOR gate 18 passes the inverse of ind_raw to data path 12. That is, NOR gate 18 operates as a masking gate or masking circuit whose output is set to zero if glitch filtering is not enabled (if pfe is a logic level zero). Note that in alternate embodiments, different gates or combination of gates may be used to provide the masking function of NOR gate 18 which selectively provides ind_raw to data path 12 depending on whether the glitch filtering is enabled or not.

Data path 12 includes a resistor-capacitor (RC) filter and Schmitt trigger inverter 36. The RC filter is formed by resistive element 20 and capacitive elements 32 and 34. The RC time constant of the RC filter is based on the total resistance of resistance element 20 and total capacitance of capacitive elements 32 and 34. The control signal pfs is a passive select filter signal which sets the resistance of resistive element 20. If pfs is asserted (a logic level 1), then resistor 24 is shorted out such that resistive element 20 includes the resistance of only resistor 26. However, if pfs is negated (a logic level 0), then resistive element 20 includes resistors 24 and 26 coupled in series and thus provides a resistance of the sum of the resistance of resistors 24 and 26. Setting the control signal edge to a logic zero causes transmission gate 28 to provide a low resistance path in parallel to resistive elements 24 and 26 so that the filter output can be rapidly reset to its steady state value. In the illustrated embodiment, the control signal pfs allows resistive element 20 to have one of two selectable resistances. Note that in alternate embodiments, a fewer or greater number of resistors may be included in resistive element 20 and may be configured in any way to provide one or more different selectable resistances.

One purpose of transmission gate 28 is to ensure that data path 12 is insensitive to the history of ind_raw. For example, when ind_raw changes from logic level zero to logic level one, the output of XOR gate 52, edge, switches from logic level zero to logic level one because ind_filt cannot respond quickly. When edge is logic level one, transmission gate 28 is in a high impedance state and node Vrc will gradually discharge from a logic level one to a logic level zero. If ind_raw returns to logic level zero before ind_filt reaches logic level one, edge will once again become logic level zero, transmission gate 28 will become low impedance, and the RC filter output, Vrc, will quickly be reset to a logic level one, rather than slowly recharging through the resistors. The glitch filter will thus respond to subsequent glitches or signals the same way that it responded to the first. Similarly, if instead of returning to a logic level zero, ind_raw stayed high until ind_filt responded, transmission gate 28 would become low impedance, node Vrc would rapidly be set to a new logic level zero steady state value. Thus, immediately after the output switches to a new value, it can still filter pulses. In contrast, if transmission gate 28 were not present, node Vrc may retain an intermediate voltage, so the history of signal ind_raw could affect the duration of signals that pass through or are blocked by the filter.

Because NOR gate 18 drives node Vrc to logic level zero when the glitch filter is disabled (pfe is logic level zero), ind_filt will initially be a logic level one. If filt_ok is a logic level one, ind_raw is a logic level zero, and the filter becomes enabled (pfe transitions from a logic level zero to a logic level one), ind will glitch to logic level one until the RC filter responds, despite ind_raw being held at logic level zero. This logical glitch can be suppressed by using data path 14 to directly pass ind_raw to ind. This is accomplished by keeping filt_ok at logic level zero until ind_raw and ind_filt are at the same logic level. One embodiment that suppresses this logic glitch is shown in FIG. 2. As long as the filter is disabled (pfe* is a logic level one), NOR gate 60 in SR latch 56 will hold filt_ok at a logic level zero. When the filter initially becomes enabled (pfe* transitions to a logic level zero), SR latch 56 will remain with filt_ok at a logic level zero until the S input (coupled to receive edge*) becomes a logic level one. XOR gate 52 operates as a difference detector whose output is asserted to a logic level one when its inputs are different, but negated when they are the same. Therefore, when ind_raw is the same as ind_filt, edge is negated to a logic level 0, and edge* to a logic level one, causing SR latch 56 to assert filt_ok to a logic level one, causing ind_filt to propagate to ind via data path 12, instead of ind_raw via data path 14. Because ind_raw and ind_filt are at the same logic state, no glitch occurs. With edge* at a logic level one, resistive element 20 in FIG. 1 is shorted out, thus disabling the RC filter. However, once ind_raw and ind_filt are different, edge is asserted to a logic level one, corresponding to occurrence of an edge (rising or falling) in ind_raw. This opens transmission gate 28 to allow resistive element 20 to operate with capacitive elements 32 and 34 as an RC filter.

Since NOR gate 18, with pfe asserted to a logic level one, allowed the inverse of ind_raw to pass through data path 12, the inverting function of inverter 36 provides the correct polarity of the filtered data to provide ind_filt. The Schmitt trigger aspect requires a greater separation between the thresholds which cause a transition of its output. That is, a non-Schmitt trigger may use a single threshold to determine when the output transitions based on the transition of the input. With a Schmitt trigger, a greater threshold is used for the input change of 0 to 1 to cause the output to transition, and a lower threshold is used for the input change from a 1 to 0 to cause the output to transition. The separation in thresholds increases the discharge time when switching states, permitting smaller resistors and capacitors.

Figure 3:
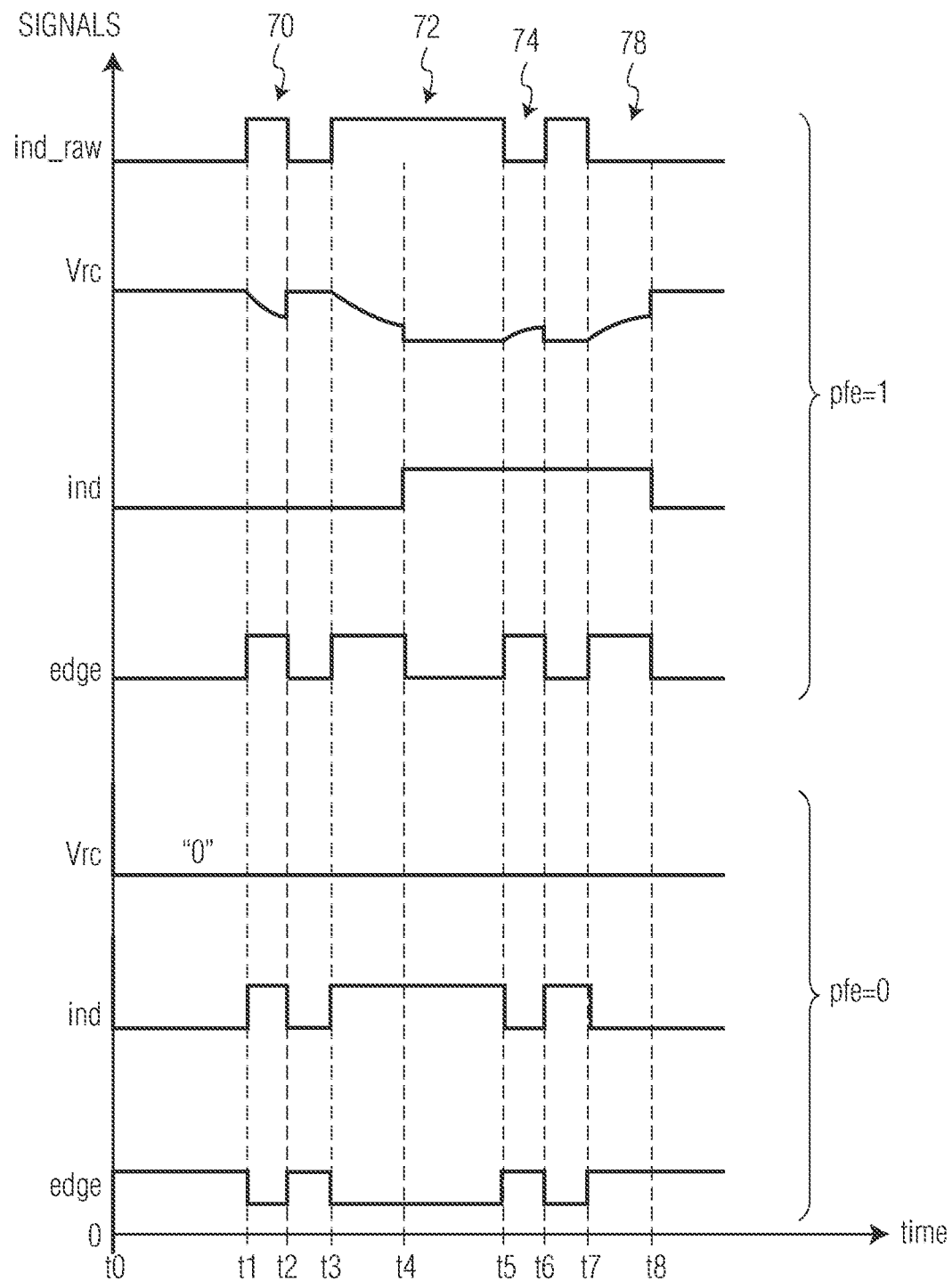
FIG. 3-5 illustrate various signals within the noise suppression circuit of FIG. 1, in accordance with embodiments of the present invention.

Operation of FIGS. 1 and 2 will be described in more detail in reference to the timing diagrams of FIGS. 3 and 4. Referring first to FIG. 3, FIG. 3 illustrates various signals, including ind_raw, Vrc (corresponding to the voltage at node Vrc in circuit 10), and ind. First, the example signal stream ind_raw is illustrated, followed by the signals Vrc, ind, and edge with filtering enabled (pfe=1), and then Vrc, ind, and edge with filtering disabled (pfe=0). The same example signal stream is used for ind_raw for both pfe=1 and pfe=0 to illustrate the difference in operation when filtering is enabled (in which ind generally corresponds to ind_filt) or disabled (in which ind corresponds to ind_raw). The example signal stream (also referred to as a data stream) is a logic level zero between time t0 and time t1, a logic level one between time t1 and time t2, a logic level zero between time t2 and t3, a logic level one between time t3 and time t5, a logic level zero between time t5 and t6, a logic level one between time t6 and time t7, and then a logic level zero again at time t8. In the example of FIG. 1, ind_raw includes a short pulse 70 at a logic level one, a long pulse 72 at a logic level one, a short pulse 74 at a logic level zero, and a long pulse 78 at a logic level zero. Pulses 70 and 72 are positive pulses corresponding to ind_raw being at a logic level one for the duration of the respective pulse, and pulses 74 and 78 are negative pulses corresponding to ind_raw being at a logic level zero for the duration of the respective pulse.

In the illustrated example of FIG. 3, with pfe=1, it is assumed that ind is the same as ind_filt. (As will be described in reference to FIG. 4, filt_ok is asserted at a delay time after asserting pfe to prevent initial glitches in ind. Once filt_ok is asserted, though, ind_filt is provided as ind by MUX 16.) With ind_raw and ind being the same, edge remains at a logic level zero (due to XOR gate 52, or other difference detector used instead of gate 52). With edge at a logic level zero, resistive element 20 is shorted out (which allows capacitive elements 32 and 34 to completely and quickly discharge). When ind_raw transitions to a logic level one at time t1, edge is also asserted by control logic 50. In response, transmission gate 28 is opened, no longer shorting out resistive element 20. At this point, the RC filter has significant delay, and the voltage at node Vrc begins to fall in accordance with the time constant of the RC filter as capacitive elements 32 and 34 discharge.

At time t2, ind_raw returns to a logic level zero, resulting in short pulse 70. A short pulse, such as pulse 70, is considered a glitch, and therefore should not appear in the filtered output, ind (corresponding to ind_filt). A glitch is any pulse, positive or negative, that has a pulse duration less than a predetermined threshold. That predetermined threshold is set based on the needs or design of the IC (such as based on the corresponding standard being implemented), and the RC filter can be designed to provide filtering for the appropriate pulse widths. When ind_raw returns to a logic level zero, edge falls again to a logic level zero. Due to the RC time constant of the RC filter, the voltage at node Vrc does not drop enough to trigger inverter 36. Therefore, pulse 70 does not propagate through inverter 36. In this manner, ind_filt (and thus ind) does not transition, but remains at a logic level zero.

Also, at time t2, ind_raw again matches ind and therefore edge transitions back to a logic level 0 which results in discharging capacitive elements 32 and 34 through transmission gate 28. At time t3, ind_raw transitions to a logic level one, at which point, edge is again asserted to a logic level one, configuring the RC filter to again have a significant delay. The voltage at node Vrc begins to fall as capacitive element 34 discharges in accordance with the time constant of the RC filter. In this example, ind_raw remains at a logic level one for more than the length of a "glitch". Therefore, the voltage at node Vrc continues to drop until triggering inverter 36 at time t4, resulting in the output of inverter 36 transitioning to a logic level one. Upon this transition, ind_raw and ind match again and therefore edge is negated, which allows the rapid discharge again of the RC filter. At time t5 ind_raw returns to a logic level zero, resulting in a pulse 72 having a long enough pulse width to not be filtered (since it is longer than a predetermine pulsewidth threshold, thus not considered a glitch). Therefore, in ind, pulse 72 appears while pulse 70 does not.

A similar situation occurs with the negative pulses. Negative pulse 74 begins at time t5 when ind_raw transitions to a logic level zero when ind_filt is at a logic level one. This transition results in edge being asserted to a logic level one and configuring the RC filter to have significant delay. The node at Vrc begins to rise as capacitive elements 32 and 34 discharge, in accordance with the time constant of the RC filter. However, at time t6, ind_raw returns to a logic level one, and edge therefore returns to a logic level zero since ind_raw again matches ind. Due to the RC time constant of the RC filter, the voltage at node Vrc did not rise sufficiently to trigger inverter 36, resulting in the filtering out of pulse 74. With edge back at a logic level zero, the RC filter is configured to have low resistance and quickly discharges capacitive elements 32 and 34, bringing the voltage at Vrc back to zero. Note that with transmission gate 28 open, the RC filter is configured to have a significant delay which is a longer delay as compared to when transmission gate 28 is closed.

At time t7, ind_raw transitions to a logic level zero, resulting in edge being asserted to a logic level one. In this example, ind_raw remains at a logic level zero long enough for capacitive element 32 to discharge and allow the voltage at Vrc to rise and trigger a transition of inverter 36 at time t8. Therefore, the longer pulse corresponding to negative pulse 78 (in which the end of pulse 78 occurs later in time, not illustrated in FIG. 3) is transmitted as part of ind. That is, it is not filtered out. Therefore, as a result, only the longer pulses, such as positive pulse 72 and negative pulse 78 are transmitted as part of the filtered signal, ind, while pulses short enough to be considered glitches (such as pulses 70 and 74) are filtered out and do not appear as part of the filtered signal, ind.

In contrast, with the filter not enabled (with pfe negated to a logic level 0), ind_raw is directly provided as ind. In this case, filt_ok can be set to select ind_raw from bypass path 14 rather than ind_filt from glitch filtering path 12. With NOR gate 18, since pfe* is a logic level one, the output of NOR gate 18, and thus node Vrc is maintained at zero, as illustrated in the bottom part of FIG. 3. Signal edge is ind_filt XOR ind_raw, and since ind_filt is held at a logic level one (due to Vrc being held at zero), edge=NOT (ind_raw). With the glitch filtering disabled, all pulses, including glitches, are transmitted as part of the unfiltered output, ind. Therefore, glitches 70 and 74 which are filtered out when filtering is enabled (pfe is asserted) are not filtered out when filtering is disabled (pfe is negated). The first version of ind with pfe=1 includes no glitches, but the second version of ind with pfe=0 includes the glitches (in which ind_raw is provided as ind without glitch filtering). Also, with pfe=0, NOR gate 18 holds the node at Vrc at zero to minimize energy loss from charging and discharging capacitive elements 32 and 34. In alternate embodiments, with different masking logic, when pfe=0, the node at Vrc can be maintained at a different constant voltage, or node Vrc may be permitted to follow ind_raw or ind_raw* (the complement of ind_raw*).

Figure 4:
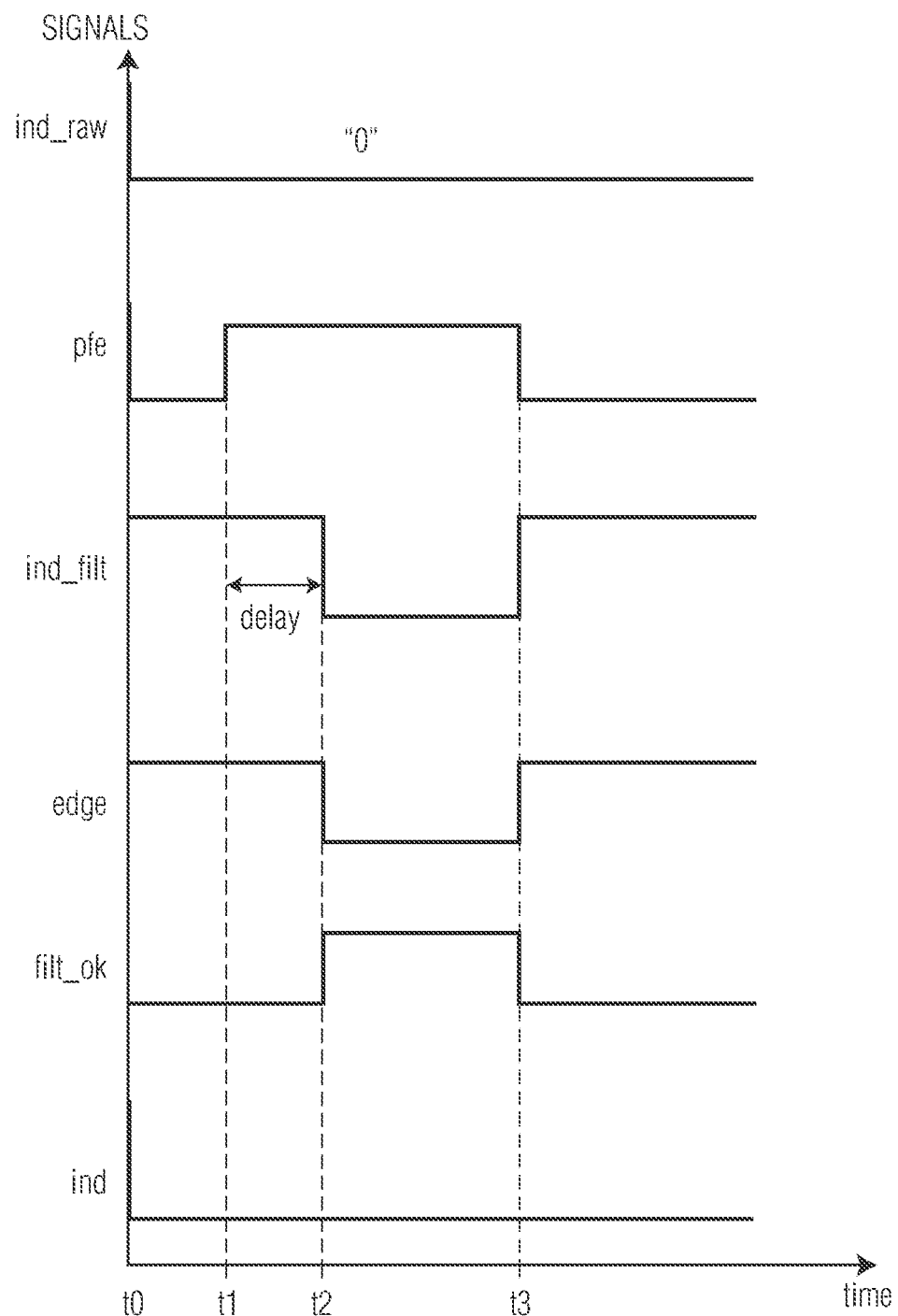
Figure 5:
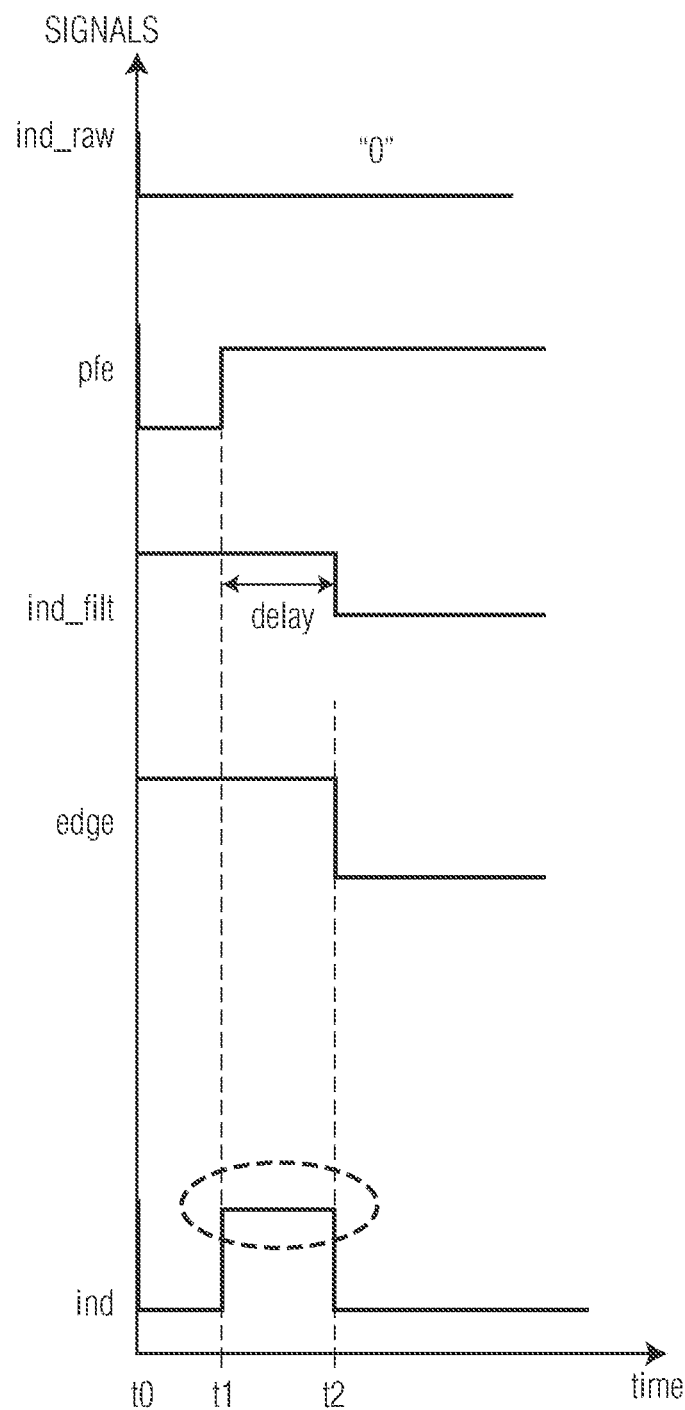

FIGS. 4 and 5 illustrate operations of noise suppression circuit 10 and control logic with and without the use of filt_ok. The use of filt_ok allows the data stored on node Vrc when pfe=0 to be overwritten by the complement of ind_raw before selecting ind_filt as the output so as to prevent glitches upon start-up of the glitch filter. For example, in FIG. 3, ind_raw is provided as a logic level zero. Prior to time t1, pfe is a logic level zero, and thus pfe* at the R input of SR latch 56 is a logic level one. This resets filt_ok to a logic level zero. With filt_ok at a logic level zero, ind_raw is selected by MUX 16 to output as ind, in which ind_raw bypasses filtering path 12. Also prior to time t1, with pfe at a logic level zero, the output of NOR gate 18 is also a logic level zero and ind_filt at the output of inverter 36 is a logic level one. Since ind_raw and ind_filt are the same, edge is also a logic level one.

At time t1, the filtering is enabled by asserting pfe to a logic level one. This causes the output of NOR gate 18 to transition to a logic level one. Due to the RC filter, after an RC delay (determined by the time constant of the RC filter), the voltage at node Vrc rises high enough to trigger inverter 36. Therefore, at time t2, after the RC delay, ind_filt at the output of inverter 36 transitions to a logic level zero. This also causes edge to transition to a logic level zero, and thus edge* to a logic level one. Since edge* is provided to the S input of SR latch 56, filt_ok goes to a logic level one at time t2. Between time t2 and t3, the glitch filter of path 12 is enabled so as to filter ind_raw to produce ind_filt, and MUX 16 selects ind_filt to provide as ind. At time t3, the filter is again disabled with the deassertion of pfe.

Note that between the time of t1 and t2, with filt_ok remaining a logic level zero, MUX 16 continues to select ind_raw to provide as ind. That is, filt_ok is not asserted to enable MUX 16 to select ind_filt instead of ind_raw to provide as ind until both ind_filt and ind_raw are the same, which may be as long as an RC time delay after the assertion of pfe. This use of filt_ok prevents any initial false glitches on ind upon enabling the glitch filtering. Also, each time pfe* is a logic level one (in which filtering is not enabled), the RC filter is discharged.

FIG. 5 illustrates an example in which filt_ok is not used to determine when to provide ind_filt rather than ind_raw as ind. In such a case, MUX 16 may select its outputs from its inputs based on the logic state of pfe. Also, SR latch 56 need not be present in control logic 50. In this example, prior to time t1, ind_raw is provided as ind, therefore, ind is at a logic level zero. Upon assertion of pfe to a logic level one at time t1, though, ind_filt is immediately provided as ind, without waiting for the glitch filter to settle. With the assertion of pfe to a logic level one (and pfe* to a logic level zero), the output of NOR gate 18 also transitions to logic level one. At time t2 (after an RC time delay), the logic level at node Vrc matches the logic level one of the output of NOR gate 18 which triggers a transition of inverter 36 such that ind_filt transitions to a logic level zero to match ind_raw. However, between t1 and t2, before inverter 36 is triggered, pfe is asserted and therefore ind_filt is immediately provided as ind. This results in ind being a logic level one until time t2, when inverter 36 is triggered to transition ind_filt back to a logic level zero. Therefore, as seen with ind in FIG. 5, a glitch is introduced on ind between time t1 and time t2 upon enabling the glitch filter (upon assertion of pfe). However, with the use of filt_ok, as in FIG. 4, a selection circuit, such as MUX 16, can continue to provide ind_raw as ind until the filter settles and is able to accurately provide the filtered signal, ind_filt, as ind.

Figure 6:
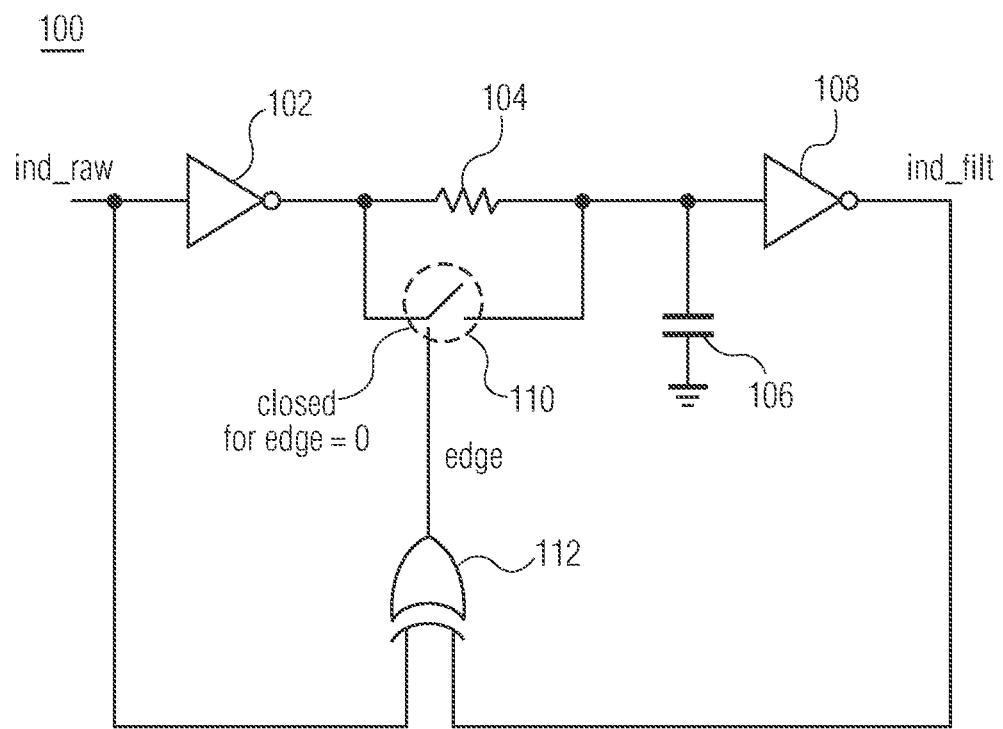
FIG. 6 illustrates, in partial block diagram and partial schematic form, a simplified version of the noise suppression circuit of FIG. 1, in accordance with one embodiment of the present invention.

FIG. 6 illustrates a simplified noise suppression circuit 100 similar to circuit 10, but without the use of filt_ok or a masking gate such as NOR gate 18. In circuit 100, an inverter 102 receives ind_raw and has an output coupled to a first terminal of resistive element 104. A second terminal of resistive element 104 is coupled to an input of an inverter 108 and to a first terminal of a capacitive element 106. A second terminal of capacitive element 106 is coupled to ground, and with resistive element 104, is configured to form an RC filter. An output of inverter 108 provide ind_filt. An XOR gate 112 (or other difference detector) receives ind_raw at a first input and ind_filt at a second input and provide edge at an output. A switch 110 is coupled between the first and second terminals of resistive element 104 such that when edge is a logic level one (indicating ind_raw and ind_filt are different), switch 110 is opened, allowing resistive element 104 to operate with capacitive element 106 as an RC filter to filter ind_raw to produce ind_filt. When edge is a logic level zero (indicating ind_raw is the same as ind_filt), switch 110 is closed so as to short out resistive element 104 such that no RC filtering is provided to ind_raw. In alternate embodiments, note that each of inverters 102 and 108 can be implemented with one or more different logic gates, and that a MUX may be added at the output to select between the unfiltered input and the output of the filter as the output of the circuit.

Therefore, by now it can be appreciated how a noise suppression circuit can selectively provide glitch filtering with an RC filter for glitches having a width less than or equal to a predetermined pulse width based on an RC time constant of the RC filter. The RC filter can have selectable configurations, such as to set a resistance value to a selected one of a plurality of values to set the RC time constant of the RC filter to different values. Furthermore, by providing a selection circuit such as MUX 16 which operates to select the filtered data stream signal only an appropriate delay time after enabling of the glitch filter, glitches in the filtered output can be avoided upon start up of the glitch filter. With selective glitch filtering, such a noise suppression circuit can be used in applications requiring glitch filtering or in applications in which glitch filtering should not be performed.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Also in one embodiment, the illustrated elements of circuit 10 and control logic 50 are circuitry located on a single integrated circuit or within a same device. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different logic and circuitry can be used to implement the switches or transmission gates of FIGS. 1 and 6. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a noise suppression circuit includes a resistor-capacitor (RC) filter where a resistive element of the RC filter has a first terminal configured to receive an input data stream and a second terminal coupled to a circuit node and a capacitive element coupled to the circuit node; a logic gate having an input coupled to the circuit node and an output configured to provide a filtered data stream; and a switch configured to short out the resistive element of the RC filter when the input data stream and the filtered data stream are at a same value and not short out the resistive element when the input data stream and the filtered data stream are at different values. In one aspect, the switch is configured to provide the input data stream to the circuit node, bypassing the resistive element, when the input data stream and the filtered data stream are at the same value. In a further aspect, the switch is configured to allow the input data stream to propagate through the resistive element to the circuit node when the input data stream and the filtered data stream are at different values. In another aspect of the above embodiment, the noise suppression circuit further includes a masking circuit, wherein the masking circuit is configured to provide the input data stream to the RC filter when glitch filtering is enabled. In a further aspect, the masking circuit is configured to provide a predetermined voltage value to the RC filter when glitch filtering is not enabled, regardless of a value of the input data stream. In another further aspect, the masking circuit includes a NOR gate, wherein a first input of the NOR gate is configured to receive an inverse of a filter enable signal, a second input of the NOR gate is configured to receive the input data stream, and an output of the NOR gate is coupled to the first terminal of the resistive element, wherein assertion of the filter enable signal indicates glitch filtering is enabled and negation of the filter enable signal indicates glitch filtering is not enabled. In another aspect, the noise suppression circuit further includes a selection circuit having a first input configured to receive the filtered data stream, a second input configured to receive the input data stream, and an output configured to provide one of the filtered data stream or the input data stream as an output data stream. In a further aspect, the selection circuit has a control input configured to receive a filter ready signal, wherein the selection circuit is configured to provide the filtered data stream when glitch filtering is enabled and the filter ready signal is asserted, and configured to provide the input data stream when glitch filtering is enabled but the filter ready signal is negated. In a further aspect, the noise suppression circuit further includes control logic configured to, when glitch filtering is enabled, assert the filter ready signal in response to the input data stream and the filtered data stream having the same value. In another aspect, the selection circuit is configured to provide the filtered data stream as the output data stream when glitch filtering, and to provide the input data stream as the output data stream when glitch filtering is not enabled. In yet another aspect, the logic gate comprises a Schmitt trigger inverter. In another aspect, the switch has a control input configured to receive a difference detection indicator, which, when asserted, configures the switch to not short out the resistive element, and which, when negated, configures the switch to short out the resistive element. In a further aspect, the noise suppression circuit further includes a difference detection circuit configured to receive the input data stream and the filtered data stream, wherein the different detection circuit is configured to assert the difference detection indicator when the input data stream and the filtered data stream are at different values and negate the difference detection indicator when the input data stream and the filtered data stream are at the same value. In another aspect, the resistive element is configured to provide a resistance selectable from a plurality of different resistances.

In another embodiment, a method includes providing an input data stream to a first data path including a resistor-capacitor (RC) filter and a logic gate, wherein the RC filter includes a resistive element and a capacitive element, and wherein an input of the logic gate is coupled to the RC filter and an output of the logic gate provides a filtered data stream; when the input stream and the filtered data stream have a same data value, providing the input data stream to the logic gate by bypassing the resistive element of the RC filter; when the input stream and the filtered data stream have different data values, providing the input stream through the resistive element of the RC filter; and selecting one of the input data stream or the filtered data stream to provide as an output data stream. In one aspect, the method further includes enabling glitch filtering, wherein the providing the input data to the first data path, the providing the input data stream to the logic gate when the input stream and the filtered data stream have the same data value, the providing the input stream through the resistive element of the RC filter when the input stream and the filtered data stream have different values, and the selecting one of the input data stream or the filtered data stream are all performed while glitch filtering is enabled; disabling glitch filtering, wherein while glitch filtering is disabled: providing the input data stream as the output data stream via a second data path which bypasses the first data path; and holding a circuit node in the first data path between the RC filter and the logic gate at a predetermined value. In a further aspect, after enabling the glitch filtering, the filtered data stream is selected to provide as the output data stream a delay time after enabling the glitch filtering. In yet a further aspect, the delay time corresponds to an amount of time after enabling glitch filtering that it takes for the input data stream and the filtered data stream to be at a same value.

In yet another embodiment, a noise suppression circuit with selective glitch filtering includes a resistor-capacitor (RC) filter where a resistive element of the RC filter has a first terminal configured to receive an input data stream and a second terminal coupled to a circuit node and a capacitive element coupled to the circuit node; a logic gate having an input coupled to the circuit node and an output configured to provide a filtered data stream; and a transmission gate configured to: provide the input data stream to the circuit node, bypassing the resistive element, when the input data stream and the filtered data stream are at the same value, and allow the input data stream to propagate through the resistive element to the circuit node when the input data stream and the filtered data stream are at different values; and a masking circuit, wherein the masking circuit is configured to: provide the input data stream to the RC filter when glitch filtering is enabled, and provide a predetermined voltage value to the RC filter when glitch filtering is not enabled, regardless of a value of the input data stream. In one aspect, the noise suppression circuit further includes a selection circuit having a first input configured to receive the filtered data stream, a second input configured to receive the input data stream, and an output configured to provide one of the filtered data stream or the input data stream as an output data stream, wherein the selection circuit is configured to select the filtered data stream as the output stream after enabling glitch filtering, once the input data stream and the filtered data stream are at a same value.

What is claimed is:

1. A noise suppression circuit, comprising:
   a resistor-capacitor (RC) filter where a resistive element of the RC filter has a first terminal configured to receive an input data stream and a second terminal coupled to a circuit node and a capacitive element coupled to the circuit node;
   a logic gate having an input coupled to the circuit node and an output configured to provide a filtered data stream; and
   a switch configured to short out the resistive element of the RC filter when the input data stream and the filtered data stream are at a same value and not short out the resistive element when the input data stream and the filtered data stream are at different values.

2. The noise suppression circuit of claim 1, wherein the switch is configured to provide the input data stream to the circuit node, bypassing the resistive element, when the input data stream and the filtered data stream are at the same value.

3. The noise suppression circuit of claim 2, wherein the switch is configured to allow the input data stream to propagate through the resistive element to the circuit node when the input data stream and the filtered data stream are at different values.

4. The noise suppression circuit of claim 1, further comprising a masking circuit, wherein the masking circuit is configured to provide the input data stream to the RC filter when glitch filtering is enabled.

5. The noise suppression circuit of claim 4, wherein the masking circuit is configured to provide a predetermined voltage value to the RC filter when glitch filtering is not enabled, regardless of a value of the input data stream.

6. The noise suppression circuit of claim 4, wherein the masking circuit comprises a NOR gate, wherein a first input of the NOR gate is configured to receive an inverse of a filter enable signal, a second input of the NOR gate is configured to receive the input data stream, and an output of the NOR gate is coupled to the first terminal of the resistive element, wherein assertion of the filter enable signal indicates glitch filtering is enabled and negation of the filter enable signal indicates glitch filtering is not enabled.

7. The noise suppression circuit of claim 1, further comprising:
a selection circuit having a first input configured to receive the filtered data stream, a second input configured to receive the input data stream, and an output configured to provide one of the filtered data stream or the input data stream as an output data stream.

8. The noise suppression circuit of claim 7, wherein the selection circuit has a control input configured to receive a filter ready signal, wherein the selection circuit is configured to provide the filtered data stream when glitch filtering is enabled and the filter ready signal is asserted, and configured to provide the input data stream when glitch filtering is enabled but the filter ready signal is negated.

9. The noise suppression circuit of claim 8, further comprising control logic configured to, when glitch filtering is enabled, assert the filter ready signal in response to the input data stream and the filtered data stream having the same value.

10. The noise suppression circuit of claim 7, wherein the selection circuit is configured to provide the filtered data stream as the output data stream when glitch filtering, and to provide the input data stream as the output data stream when glitch filtering is not enabled.

11. The noise suppression circuit of claim 1, wherein the logic gate comprises a Schmitt trigger inverter.

12. The noise suppression circuit of claim 1, wherein the switch has a control input configured to receive a difference detection indicator, which, when asserted, configures the switch to not short out the resistive element, and which, when negated, configures the switch to short out the resistive element.

13. The noise suppression circuit of claim 12, further comprising a difference detection circuit configured to receive the input data stream and the filtered data stream, wherein the different detection circuit is configured to assert the difference detection indicator when the input data stream and the filtered data stream are at different values and negate the difference detection indicator when the input data stream and the filtered data stream are at the same value.

14. The noise suppression circuit of claim 12, wherein the resistive element is configured to provide a resistance selectable from a plurality of different resistances.

15. A method, comprising:
providing an input data stream to a first data path including a resistor-capacitor (RC) filter and a logic gate, wherein the RC filter includes a resistive element and a capacitive element, and wherein an input of the logic gate is coupled to the RC filter and an output of the logic gate provides a filtered data stream;
when the input data stream and the filtered data stream have a same data value, providing the input data stream to the logic gate by bypassing the resistive element of the RC filter;
when the input data stream and the filtered data stream have different data values, providing the input data stream through the resistive element of the RC filter; and
selecting one of the input data stream or the filtered data stream to provide as an output data stream.

16. The method of claim 15, further comprising:
enabling glitch filtering, wherein the providing the input data stream to the first data path, the providing the input data stream to the logic gate when the input data stream and the filtered data stream have the same data value, the providing the input data stream through the resistive element of the RC filter when the input data stream and the filtered data stream have different values, and the selecting one of the input data stream or the filtered data stream are all performed while glitch filtering is enabled;
disabling glitch filtering, wherein while glitch filtering is disabled:
providing the input data stream as the output data stream via a second data path which bypasses the first data path; and
holding a circuit node in the first data path between the RC filter and the logic gate at a predetermined value.

17. The method of claim 16, wherein after enabling the glitch filtering, the filtered data stream is selected to provide as the output data stream a delay time after enabling the glitch filtering.

18. The method of claim 17, wherein the delay time corresponds to an amount of time after enabling glitch filtering that it takes for the input data stream and the filtered data stream to be at a same value.

19. A noise suppression circuit with selective glitch filtering, comprising:
a resistor-capacitor (RC) filter where a resistive element of the RC filter has a first terminal configured to receive an input data stream and a second terminal coupled to a circuit node and a capacitive element coupled to the circuit node;
a logic gate having an input coupled to the circuit node and an output configured to provide a filtered data stream; and
a transmission gate configured to:
provide the input data stream to the circuit node, bypassing the resistive element, when the input data stream and the filtered data stream are at the same value, and
allow the input data stream to propagate through the resistive element to the circuit node when the input data stream and the filtered data stream are at different values; and
a masking circuit, wherein the masking circuit is configured to:
provide the input data stream to the RC filter when glitch filtering is enabled, and
provide a predetermined voltage value to the RC filter when glitch filtering is not enabled, regardless of a value of the input data stream.

20. The noise suppression circuit of claim 19, further comprising:
a selection circuit having a first input configured to receive the filtered data stream, a second input configured to receive the input data stream, and an output configured to provide one of the filtered data stream or the input data stream as an output data stream, wherein the selection circuit is configured to select the filtered data stream as the output stream after enabling glitch filtering, once the input data stream and the filtered data stream are at a same value.

* * * * *